United States Patent
Lau

(10) Patent No.: US 9,977,073 B2
(45) Date of Patent: May 22, 2018

(54) ON-DIE VERIFICATION OF RESISTOR FABRICATED IN CMOS PROCESS

(71) Applicant: Integrated Device Technology, Inc., San Jose, CA (US)

(72) Inventor: Pak-Kim Lau, Sunnyvale, CA (US)

(73) Assignee: INTEGRATED DEVICE TECHNOLOY, INC., San Jose, CA (US)

( * ) Notice: Subject to any disclaimer, the term of this patent is extended or adjusted under 35 U.S.C. 154(b) by 173 days.

(21) Appl. No.: 15/178,650

(22) Filed: Jun. 10, 2016

(65) Prior Publication Data

US 2017/0356952 A1  Dec. 14, 2017

(51) Int. Cl.
| | |
|---|---|
| *G01R 31/26* | (2014.01) |
| *G01R 27/26* | (2006.01) |
| *H01L 49/02* | (2006.01) |
| *H01L 21/66* | (2006.01) |

(52) U.S. Cl.
CPC ..... *G01R 31/2639* (2013.01); *G01R 27/2605* (2013.01); *H01L 22/14* (2013.01); *H01L 28/20* (2013.01)

(58) Field of Classification Search
CPC .... G01R 31/00; G01R 31/001; G01R 31/002; G01R 31/08; G01R 31/12; G01R 31/2639; G01R 27/00; G01R 27/26; G01R 27/2605; H01L 22/00; H01L 22/10; H01L 22/14; H01L 28/00; H01L 28/20
USPC ..... 324/500, 512, 522, 537, 549, 71.1, 71.5, 324/600, 649, 691, 713, 719; 438/14, 17
See application file for complete search history.

(56) References Cited

U.S. PATENT DOCUMENTS

| | | | | |
|---|---|---|---|---|
| 5,225,837 | A * | 7/1993 | Hosotani | H03M 1/362 341/158 |
| 5,517,107 | A | 5/1996 | Ovens et al. | 324/158.1 |
| 5,534,757 | A * | 7/1996 | Takatori | H04N 3/26 315/382 |
| 5,610,535 | A * | 3/1997 | Masaki | H03K 19/17704 326/39 |
| 6,937,028 | B2 | 8/2005 | Tan | 324/601 |
| 7,042,271 | B2 | 5/2006 | Chung et al. | 327/341 |
| 7,061,406 | B1 * | 6/2006 | Dally | H03M 5/12 341/50 |
| 9,148,087 | B1 * | 9/2015 | Tajalli | H03F 1/0205 |

(Continued)

OTHER PUBLICATIONS

Khan, Qadeer A. et al., "Techniques for On-Chip Process Voltage and Temperature Detection and Compensation", 19th International Conference on VLSI Design held jointly with 5th International Conference on Embedded Systems Design (VLSID'06), Jan. 3-7, 2006, 7 pages.

*Primary Examiner* — Hoai-An D Nguyen
(74) *Attorney, Agent, or Firm* — Christopher P. Maiorana, PC

(57) ABSTRACT

An apparatus includes a resistor and a circuit. The resistor may be fabricated on a die using a semiconductor process. The circuit may be fabricated on the die using the semiconductor process and may be configured to (i) generate a measurement voltage at a node of the resistor as a function of a capacitance value and a frequency of a clock signal and (ii) generate a codeword in response to the measurement voltage. The codeword generally has a plurality of possible values. A particular value of the possible values may verify that the voltage is between a plurality of threshold voltages.

20 Claims, 7 Drawing Sheets

(56) References Cited

U.S. PATENT DOCUMENTS

| | | | |
|---|---|---|---|
| 9,761,325 B1* | 9/2017 | Shi .................... | G11C 29/021 |
| 2001/0022505 A1* | 9/2001 | Ohno .................. | H02K 23/66 |
| | | | 318/560 |
| 2003/0042971 A1* | 3/2003 | Oikawa ................ | G05F 1/56 |
| | | | 327/540 |
| 2004/0136440 A1* | 7/2004 | Miyata ................ | H03C 3/095 |
| | | | 375/130 |
| 2005/0264347 A1* | 12/2005 | Gyohten .............. | G05F 1/465 |
| | | | 327/540 |
| 2010/0264943 A1 | 10/2010 | Matsuno ............... | 324/705 |
| 2014/0266290 A1 | 9/2014 | Odedara et al. ...... | 324/762.01 |
| 2015/0323567 A1 | 11/2015 | Kitahara et al. ...... | 324/126 |

\* cited by examiner

ON-DIE VERIFICATION OF RESISTOR FABRICATED IN CMOS PROCESS

FIELD OF THE INVENTION

The invention relates to semiconductor process variations generally and, more particularly, to a method and/or apparatus for on-die verification of a resistor fabricated in a complementary metal-oxide-semiconductor (CMOS) process.

BACKGROUND

Conventional polysilicon resistors fabricated with various types of dopants are widely use in CMOS silicon chip applications. The resistors provide known relationships between voltages applied across the resistors and currents flowing through the resistors. Doping levels established during the fabrication process vary from run to run and/or from side to side on a wafer. Therefore, unit square resistances among many polysilicon resistors vary widely, in many cases by as much as ±20 percent.

Absolute resistor values play roles in the operations of many types of circuits. Although a dependence on the absolute resistor value is eliminated in many circuit designs by using ratios of resistors, many circuit aspects rely on the absolute value of the polysilicon resistors. Conventional techniques for verification of the resistance values usually use an external precision resistor during a test phase to measure and trim the polysilicon resistors. Use of the external precision resistor increases test time.

It would be desirable to implement a method and/or apparatus for on-die verification of a resistor fabricated in a CMOS process.

SUMMARY

The invention concerns an apparatus including a resistor and a circuit. The resistor may be fabricated on a die using a semiconductor process. The circuit may be fabricated on the die using the semiconductor process and may be configured to (i) generate a measurement voltage at a node of the resistor as a function of a capacitance value and a frequency of a clock signal and (ii) generate a codeword in response to the measurement voltage. The codeword generally has a plurality of possible values. A particular value of the possible values may verify that the voltage is between a plurality of threshold voltages.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for on-die verification of a resistor fabricated in a CMOS process that may (i) detect large variations in a resistor value, (ii) enable real-time feedback while the resistor value is adjusted, (iii) detect the variations over a programmable window, (iv) avoid the use of external precision resistors, (v) be performed at power-up, (vi) be performed during normal operation of a circuit, (vii) improve consistency of the circuit and/or (viii) be implemented as one or more integrated circuits.

Embodiments of the invention generally provide a technique to detect variations in resistors fabricated in (on) semiconductor dies such that an automatic correction is possible. The technique generally avoids testing with external precision resistors and laser trimming. Resistor value verification may be utilized in a calibration process to reduce the variations to a small range, thereby improving consistency of circuits designed with such calibrated resistors. The resistor value verification technique may be used at die power-up and/or during device operation without adding to a test time.

Various embodiments generally incorporate thin and/or thick oxide metal-oxide-semiconductor (MOS) varactors (e.g., in an accumulation mode) on-chip to emulate a controllable impedance. Benefits of the varactors (e.g., controllable capacitors) may include, but are not limited to, small capacitance variations (e.g., about ±4 percent) across process variations and impedance control by a switching frequency. The capacitance variation may result in an emulated impedance (e.g., K) that has a similar small variation. The variation of the impedance K may be less than the variation of the resistors making the detection of large resistance variations possible.

Figure 1:
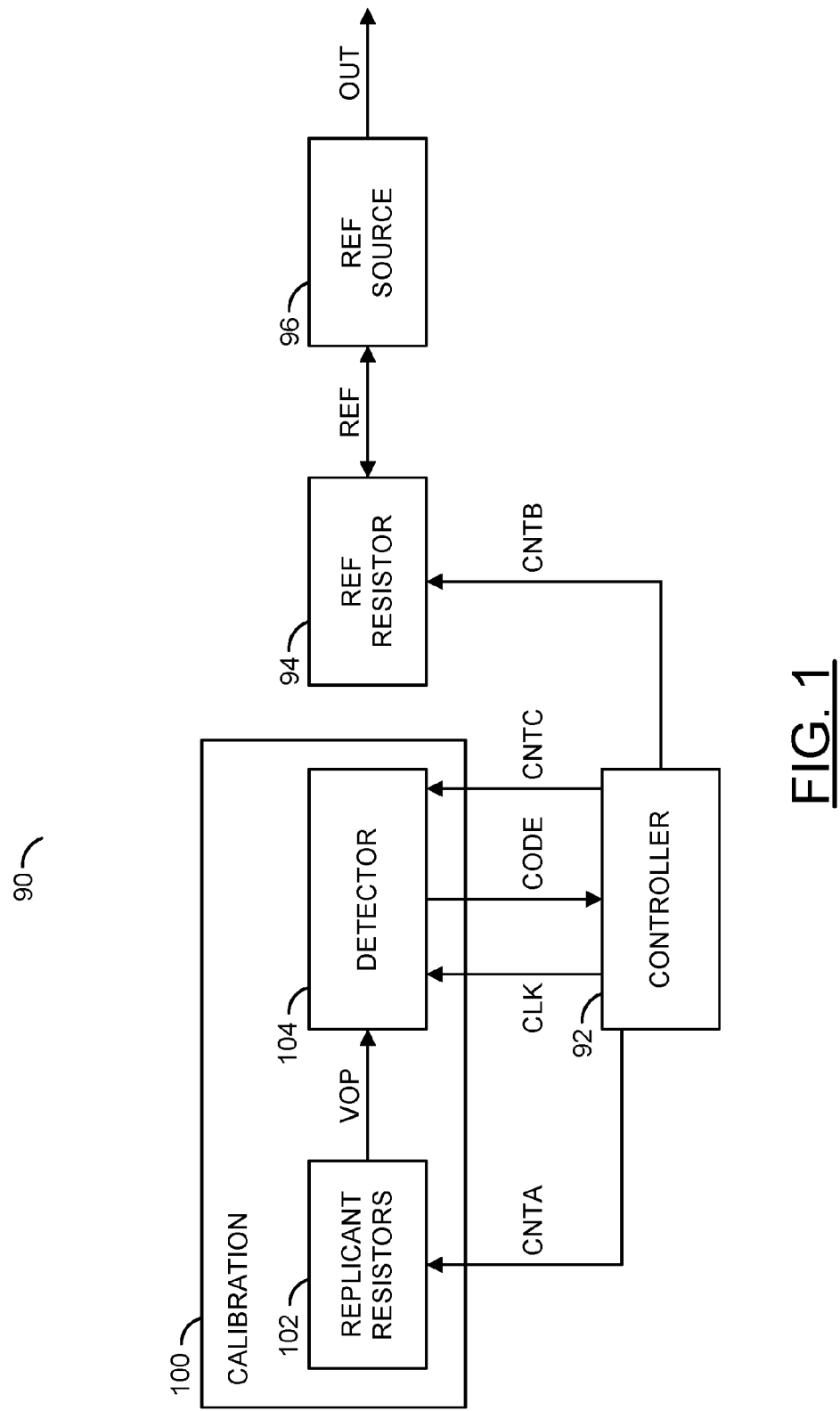
FIG. 1 is a block diagram of a die.

Referring to FIG. 1, a block diagram of a die 90 is shown. The die (or chip or integrated circuit) 90 may be fabricated using a semiconductor process. In various embodiments, the semiconductor process may be a metal-oxide-semiconductor (MOS). In other embodiments, the semiconductor process may be a complementary metal-oxide-semiconductor (CMOS) process. Other semiconductor fabrication processes may be implemented to meet the design criteria of a particular application.

The die 90 generally comprises a block (or circuit) 92, a block (or circuit) 94, a block (or circuit) 96 and a block (or circuit) 100. The circuit 100 generally comprises a block (or circuit) 102 and a block (or circuit) 104. A signal (e.g., CLK) may be generated by the circuit 92 and presented to the circuit 104. The signal CLK may implement a clock signal having a switching frequency. A signal (e.g., CNTA) may be generated by the circuit 92 and presented to the circuit 102. The control signal CNTA may implement a resistance value control signal. A signal (e.g., CNTB) may be generated by the circuit 92 and received by the circuit 94. The control signal CNTB may implement another resistance value control signal. A signal (e.g., CNTC) may be generated by the circuit 92 and received by the circuit 104. The control signal CNTC may implement a threshold voltage control signal.

The circuit 102 may generate a signal (e.g., VOP) received by the circuit 104. The measurement signal VOP may carry a measured voltage. A signal (e.g., CODE) may be generated by the circuit 104 and transferred to the circuit 92. The signal CODE may convey a codeword. In various embodiments, the codeword may be a multi-bit (e.g., 2-bit) codeword. The circuit 94 may communicate with the circuit 96 via a signal (e.g., REF). The signal REF may carry a reference value (e.g., a reference resistance). A signal (e.g., OUT) may be generated and presented by the circuit 96. The signal OUT may carry another reference value (e.g., a reference voltage, a reference current, a reference frequency, or a reference phase).

The circuit 92 may implement a controller circuit. The controller 92 is generally operational to control one or more programmable resistance values in the circuit 102, multiple impedance values in the circuit 104, multiple threshold voltage values in the circuit 104, and one or more resistance values in the circuit 94. Control of the resistance values in the circuit 102 may be achieved by transferring one or more resistance control values in the signal CNTA. Control of the resistance values in the circuit 94 may be achieved transferring one or more resistance control values in the signal CNTB. In some embodiments, the control values in the signals CNTA and CNTB may be the same value. The threshold voltages in the circuit 104 may be controlled by transferring one or more threshold control values in the signal CNTC. Control of the impedance values in the circuit 104 may be achieved by adjusting the switching frequency of the signal CLK. In various embodiments, the signal CLK may have a 50 percent duty cycle. Other duty cycles may be implemented to meet the criteria of a particular application.

The circuit 94 may implement one or more reference resistors (one shown for clarity). A resistance value of the reference resistor 94 may be coupled to the circuit 96 via the signal REF. The value in the signal REF may be used by the circuit 96 to generate the signal OUT. The resistance value of the reference resistor 94 may be controlled by the controller 92 via the signal CNTB. In various embodiments, the reference resistor 94 may be fabricated in (on) the die 90 using a semiconductor process. In some applications, the semiconductor process may include a polysilicon process (e.g., forming resistors in a polysilicon layer). In some applications, the semiconductor process may be part of an MOS process or a CMOS process.

The circuit 96 may implement one or more reference source circuits (one shown for clarity). The reference source 96 may be operational to generate the reference signal OUT based on the resistance value of the reference resistor 94 according to the signal REF. In various embodiments, the signal OUT may convey reference information (e.g., a reference voltage, a reference current, a reference frequency, a reference phase, or the like). Other types of circuits that rely on the resistance of the reference resistor 94 may be implemented to meet the design criteria of a particular application.

In an example embodiment, the reference source 96 may implement a reference current source. A reference current delivered in the signal OUT may be derived from a bandgap voltage circuit and the reference resistor 94. The bandgap voltage may be constant over process variations, voltage variations and temperature variations (PVT). The resistance value of the resistor 94 may vary over the process variations and/or temperature variations. The circuit 100 may be configured to provide an accurate estimate of the resistance value of the reference (or additional) resistor 94 using replicant (or copied) resistors in the circuit 100. The controller 92 may adjust the resistance values of the replicant resistors within the circuit 100 using control words the signal CNTA to account for the process variations and/or temperature variations. Once the codeword in the signal CODE verifies that the resistance values of the replicant resistors have been calibrated to within an acceptable window, the controller 92 may apply the same control word to the reference resistor 94 in the signal CNTB. Where the reference resistor 94 and the replicant resistors in the circuit 100 have similar layouts, similar designs, and are near each other on the die 90, the reference resistor 94 may have approximately the same resistance value as the calibrated replicant resistors in the circuit 100. In various embodiments, the control words in the signals CNTA and CNTB may be changed together.

In another example, the reference source 96 may implement a phase-locked loop (PLL) circuit. A bandwidth of the PLL 96 is generally based on a passive resistive-capacitive circuit that forms a loop filter. A frequency characteristic of the loop filter generally depends on the absolute value of the reference resistor 94, among other factors. By calibrating the replicant resistors in the circuit 100 and applying the same adjustment to the reference resistor 94, appropriate corrections may be made to the loop filter to account for process variations and/or temperature variations.

The circuit 100 may be implemented as a calibration circuit. The calibration circuit 100 is generally operational to detect if a voltage related to a resistance value of one or more replicant resistors is above, between, or below a set of threshold voltages. The detection may be based on the frequency of the signal CLK and/or the voltage levels of the threshold voltages. For larger die 90, multiple instantiations of the calibration circuit 100 and/or the controller 92 may be implemented to account for different temperatures at different locations.

The circuit 102 may implement one or more replicant resistors. In some embodiments, the circuit 102 may contain multiple (e.g., two) replicant resistors wired in parallel. The replicant resistors 102 may be electrical copies (or instantiations) of each other and of the reference resistor 94. The replicant resistors 102 generally track the process variations and the temperature variations of the reference resistor 94. Each replicant resistor 102 may have a variable resistance value that is programmable (or adjustable) over a range of resistance values. In various embodiments, each replicant resistor may have a range of adjustment (e.g., ±30 percent) greater than the expected unit square tolerance during fabrication (e.g., ±20 percent).

Control of the absolute resistance value of each replicant resistor 102 may be governed by the signal CNTA. The replicant resistors 102 may determine a measurement voltage value in the signal VOP. In various embodiments, the replicant resistors 102 may be fabricated in (on) the die 90 using the same semiconductor process as the reference resistor 94. The semiconductor process may include the polysilicon process. The semiconductor process may be part of the MOS process or the CMOS process. In some embodiments, as the resistance values are decreased, the voltage in the signal VOP may increase. As the resistance values are increased, the voltage in the signal VOP may decrease.

In other embodiments, the replicant resistors 102 may contain a single resistive element. The single resistor embodiment may have a resistance that tracks the process variations and the temperature variations of the reference resistor 94. The single resistor embodiment may have a resistance value of half that of the reference resistor 94 or the same resistance value as the reference resistor 94.

The circuit 104 may implement a detector circuit. The detector 104 is generally operational to generate the codeword in the signal CODE based on the voltage received in the measurement signal VOP. Generation of the signal CODE may be based on the threshold voltages programmed per the signal CNTC and the frequency of the clock signal CLK. The codeword may indicate if the voltage in the signal VOP is too high, too low, in an acceptable window or invalid. Where the codeword indicates that the voltage in the signal VOP is in the acceptable window, the replicant resistors 102 may be considered calibrated.

Figure 2:
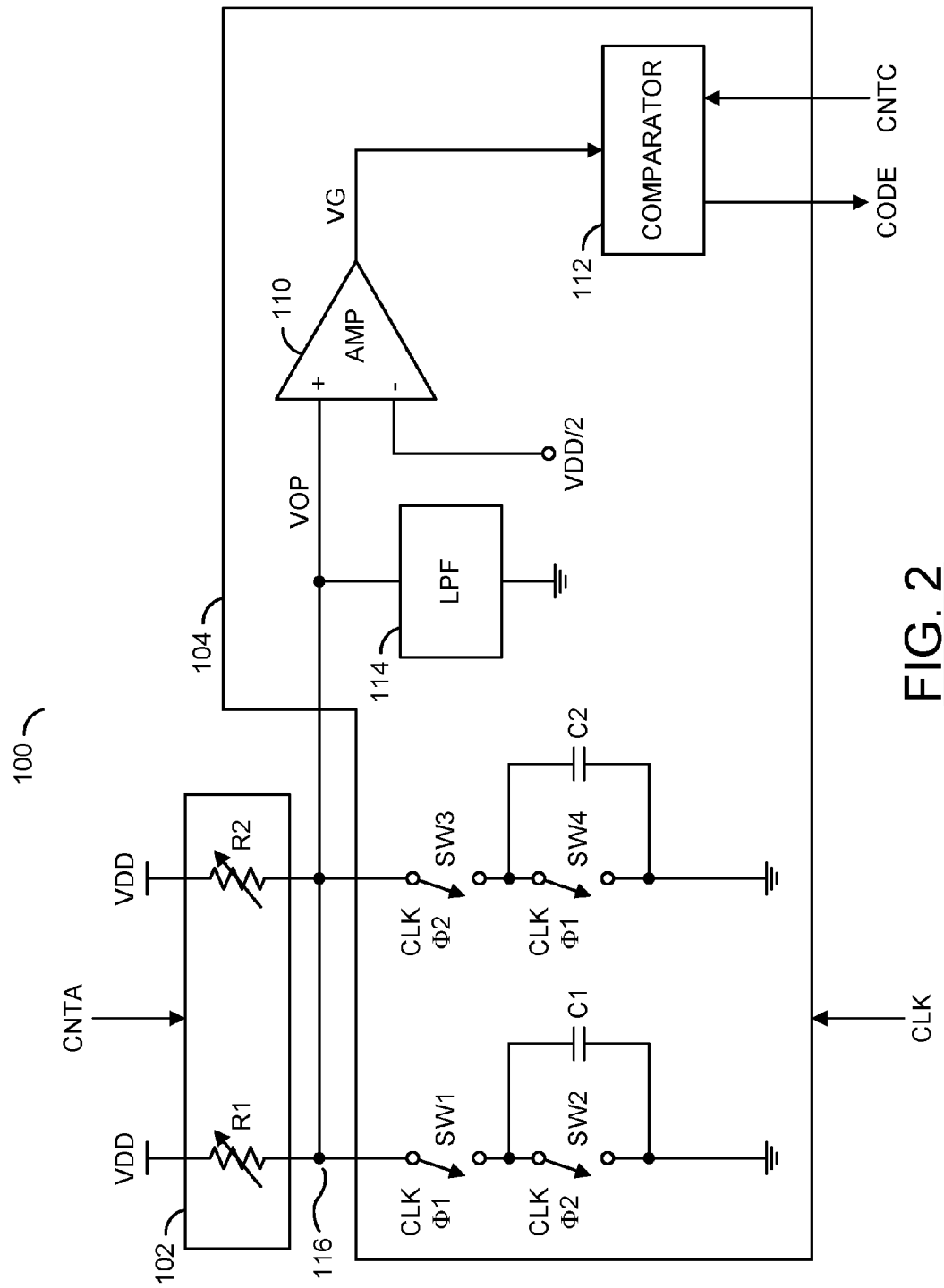
FIG. 2 is a block diagram of a calibration circuit on the die in accordance with an embodiment of the invention.

Referring to FIG. 2, a block diagram of an example implementation of the calibration circuit 100 is shown in accordance with an embodiment of the invention. The replicant resistors 102 generally comprise two resistors (e.g., R1 and R2). The detector 104 generally comprises multiple switches (e.g., SW1 to SW4), multiple capacitors (e.g., C1 to C2), a block (or circuit) 110, a block (or circuit) 112 and a block (or circuit) 114.

The signal CNTA may be received by the replicant resistors R1 and R2. The signal CLK may be received by the switches SW1 to SW4. The signal VOP may be received by all of the switches SW1 and SW3, the circuit 110 and the circuit 114. A signal (e.g., VG) may be generated by the circuit 110 and received by the circuit 112. The gain signal VG may carry a voltage related to a difference between a fixed voltage (e.g., VDD/2) and the measured voltage in the signal VOP. The circuit 112 may receive the signal CNTC. The circuit 112 may generate the signal CODE.

The replicant resistors R1 and R2 may be wired in parallel between a power supply voltage (e.g., VDD) and a node 116 carrying the signal VOP. The replicant resistors R1 and R2 may be programmed to the same resistive value by the signal CNTA. The replicant resistors R1 and R2 may be copies of each other and located near each other on the die 90 to respond similarly to the process variations and the temperature variations.

The capacitors C1 and C2 may be wired in parallel between the node 116 and a ground voltage of the power supply. The capacitors C1 and C2 may be copies of each other and located near each other on the die 90 to respond similarly to the process variations, the voltage variations and the temperature variations.

The switches SW1 and SW3 may be located between the respective capacitors C1 and C2 and the node 116. The switches SW2 and SW4 may each be wired in parallel to the respective capacitors C1 and C2. The switches SW1 and SW4 may be closed on a phase (e.g., Φ1) of the signal CLK and open on the other phase (e.g., Φ2). The switches SW2 and SW3 may be open on the phase Φ1 of the signal CLK and closed on the phase Φ2. The phases Φ1 and Φ2 may by opposite phases of the signal CLK, non overlapping, and approximately 50 percent in duty cycle. In various embodiments, the switches SW1 to SW4 may be implemented as MOS and/or CMOS switches.

The circuit 110 may be implemented as a linear amplifier. The amplifier 110 is generally operational to generate the gain signal VG as an amplified difference between the signal VOP and the fixed voltage VDD/2. The signal VOP may have a voltage swing from above to below the fixed voltage VDD/2. In some embodiments, a gain of the amplifier 110 may be between unity and approximately twenty.

The circuit 112 may be implemented as a comparator circuit. The comparator circuit 112 is generally operational to compare the voltage received in the signal VG to two internal threshold voltages. The comparison may produce a two-bit codeword. The codeword may indicate if the voltage in the signal VOP is above both threshold voltages, between the threshold voltages, or below both threshold voltages.

The circuit 114 may be implemented as a low pass filter (LPF) circuit. The low pass filter 114 may be operational to smooth the voltage in the signal VOP. The low pass filter 114 may reduce or eliminate any noise transferred from the signal CLK into the signal VOP.

A resistance divider is generally formed between the replicant resistor R1 and R2 and the impedances K1 and K2 created by the capacitors C1 and C2 respectively. The capacitors C1 and C2 may be used to create the impedances K1 and K2 with the help of the switches SW1 to SW4 and the clock signal CLK operating at a known frequency. The value of the impedances K1 and K2 may be approximated by formula (1) as follows:

$$K1=K2=1/(Fclk \times C) \quad (1)$$

Where Fclk may be the frequency of the signal CLK in hertz and C may be the value of each capacitor C1 and C2 in Farads. A precise clock frequency Fclk may be generated by the controller 102.

The capacitor C1 may be charged to a voltage (e.g., Vop) on the node 116 during an active portion of the phase Φ1 of the signal CLK and thus store a charge of Vop×C coulombs. During an active portion of the phase Φ2, the charge on the capacitor C1 may be shunted to ground through the switch SW2. The average current conducted by C1, and thus through the parallel network formed by the replicant resistors R1 and R2, may be determined by formula (2) as follows:

$$I1=Vop/K1=Vop \times (C1 \times Fclk) \quad (2)$$

The same action may be repeated for the capacitor C2 but occur on the opposite phases. The capacitor C2 may be charged to voltage Vop on the node 116 during the active portion of the phase Φ2 and shunted to ground during the active portion of the phase Φ1. The average current conducted by C2, and thus through the parallel network formed by the replicant resistors R1 and R2, may be determined by formula (3) as follows:

$$I2=Vop/K2=Vop \times (C2 \times Fclk) \quad (3)$$

Alternating between charging C1/C2 and discharging C2/C1 on opposite phases of the signal CLK generally ensures that current is flowing through the network formed by the replicant resistors R1 and R2 in both phases of the clock CLK. In various embodiments, the resistors R1 and R2 may be copies of each other and the capacitors C1 and C2 may be copies of each other. Therefore, R1=R2, C1=C2, K1=K2, I1=I2 and the voltage Vop in the signal VOP may be controlled by the frequency of the clock signal CLK. The resistors R1 and R2 and the capacitors C1 and C2 effectively form a resistance divider. If the impedances K1 and K2 are designed to match R1 and R2 in normal operation, by choosing the capacitances of C1 and C2 and the frequency Fclk of the signal CLK appropriately, the voltage Vop in the signal VOP may be approximately VDD/2 and the voltage in the signal VG may be approximately VDD/2.

Figure 3:
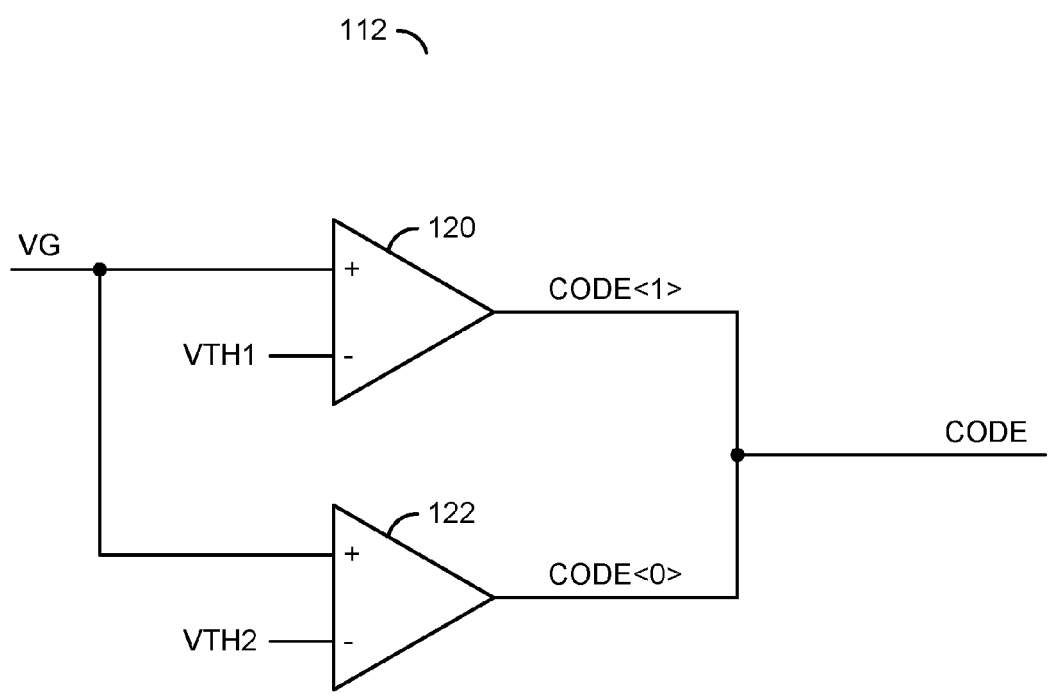
FIG. 3 is a block diagram of a comparator circuit.

Referring to FIG. 3, a block diagram of an example implementation of the comparator circuit 112 is shown. The comparator circuit 112 generally comprises a block (or circuit) 120 and a block (or circuit) 122. The signal VG may be received by an input node (e.g., a positive input node) of each circuit 120 and 122. A high threshold voltage (e.g., VTH1) may be received by another input (e.g., a negative input) of the circuit 120. A low threshold voltage (e.g., VHT2) may be received by another input (e.g., the negative input) of the circuit 122. A bit (e.g., <1>) of the codeword in the signal CODE may be generated by the circuit 120. Another bit (e.g., <0>) of the codeword in the signal CODE may be generated by the circuit 122.

Each circuit 120 and 122 may be implemented as a comparator. The comparator 120 may generate a logical one (or high) in the respective bit of the codeword where the voltage in the signal VG is greater than the threshold voltage VTH1. Otherwise, the respective bit in the codeword may be a logical zero (or low). The comparator 122 may generate a logical one (or high) in the respective bit of the codeword where the voltage in the signal VG is greater than the threshold voltage VTH2. Otherwise, the respective bit in the codeword may be a logical zero (or low).

If the voltage in the signal VG is higher than both threshold voltages VTH1 and VTH2, the controller 92 may conclude that the process and/or temperature has caused the resistance of the replicant resistors 102 to be too small and an appropriate correction may be made. If the voltage in the signal VG is lower than both threshold voltages VTH1 and VTH2, the controller 92 may conclude that the process and/or temperature has caused the resistance of the replicant resistors 102 to be too large and an appropriate correction may be made. Possible values of the codeword in the signal CODE may be given by Table I as follows:

TABLE I

| CODE<1:0> | Resistance is determined to be: |
|---|---|
| 11 | Too small |
| 10 | Not valid |
| 01 | Within the range determined by VHT1 and VHT2 |
| 00 | Too big |

By way of example, the amplified voltage in the signal VG may be compared with VTH1=1.3 volts and VTH2=0.5 volts. The voltage range between VTH1 and VTH2 generally determines how sensitive the comparator circuit 112 is to the resistance variation from the norm established by the impedance K.

In various embodiments, the comparator circuit 112 may include three or more individual comparators with three or more threshold voltages and a corresponding increase in the number of codeword bits in the signal CODE. The additional comparators and threshold voltages generally provide multiple windows to detect the voltage on the signal VG. In some designs, one to all of the threshold voltages may be fixed voltages.

Figure 4:
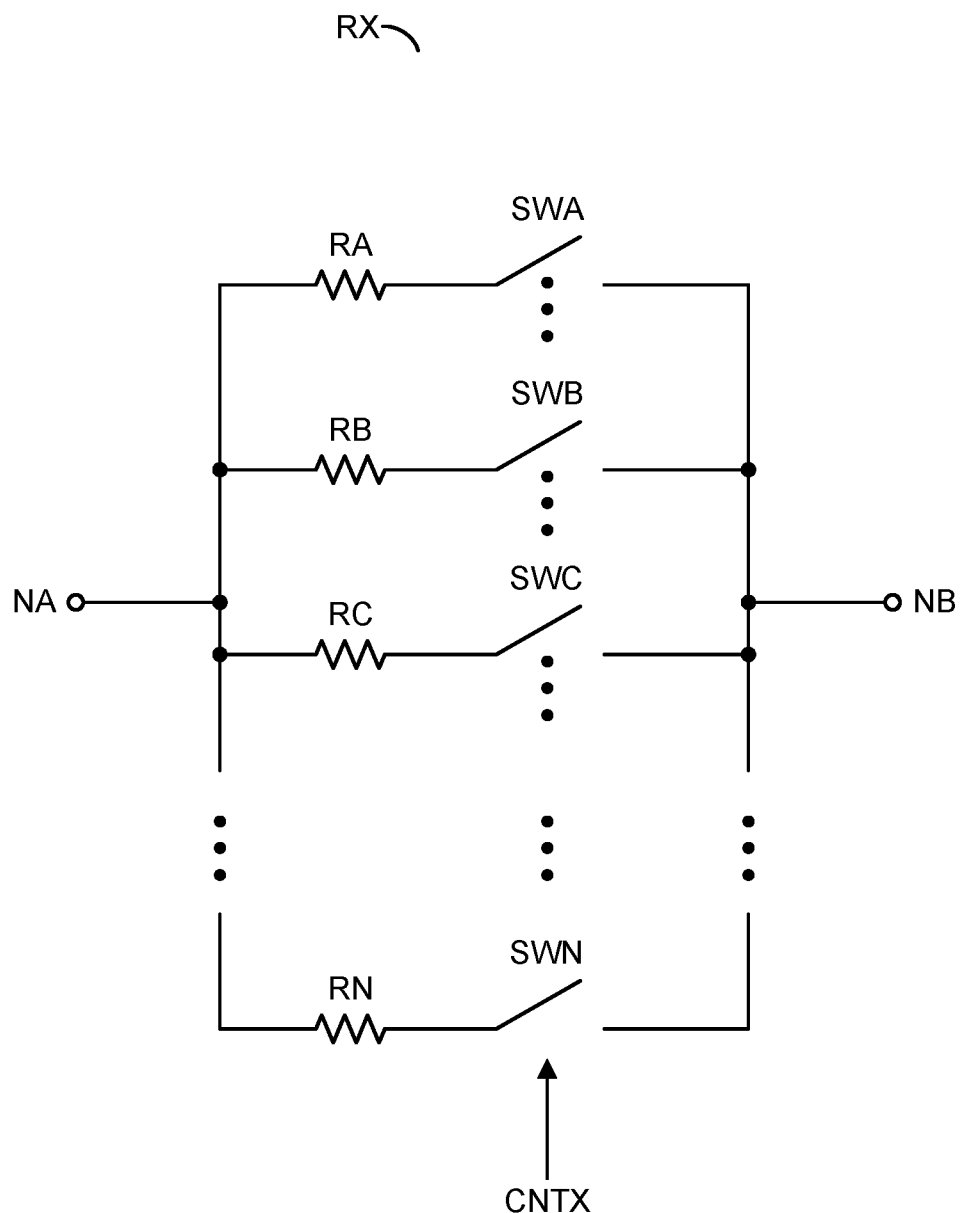
FIG. 4 is a schematic diagram of a programmable resistor.

Referring to FIG. 4, a schematic diagram of an example implementation of a programmable resistor RX is shown. The resistor RX may represent each of the replicant resistors R1 and R2 and/or the reference resistor 94. The resistor RX generally comprises multiple fixed resistors RA to RN connected to a node NA. Multiple switches SWA to SWN may connect the respective resistors RA to RN to another node NB. In various embodiments, each switch SWA to SWN may be implemented as a MOS or CMOS switch.

A signal (e.g., CNTX) may be received by switches SWA to SWN. The control signal CNTX may represent the control signals CNTA and/or CNTB. The signal CNTX may be a multi-bit (e.g., N-bit) signal with a respective bit controlling each switch SWA to SWN. By selectively opening and closing the switches SWA to SWN, a variety of resistance values may be programmed from the resistor RX.

Figure 5:
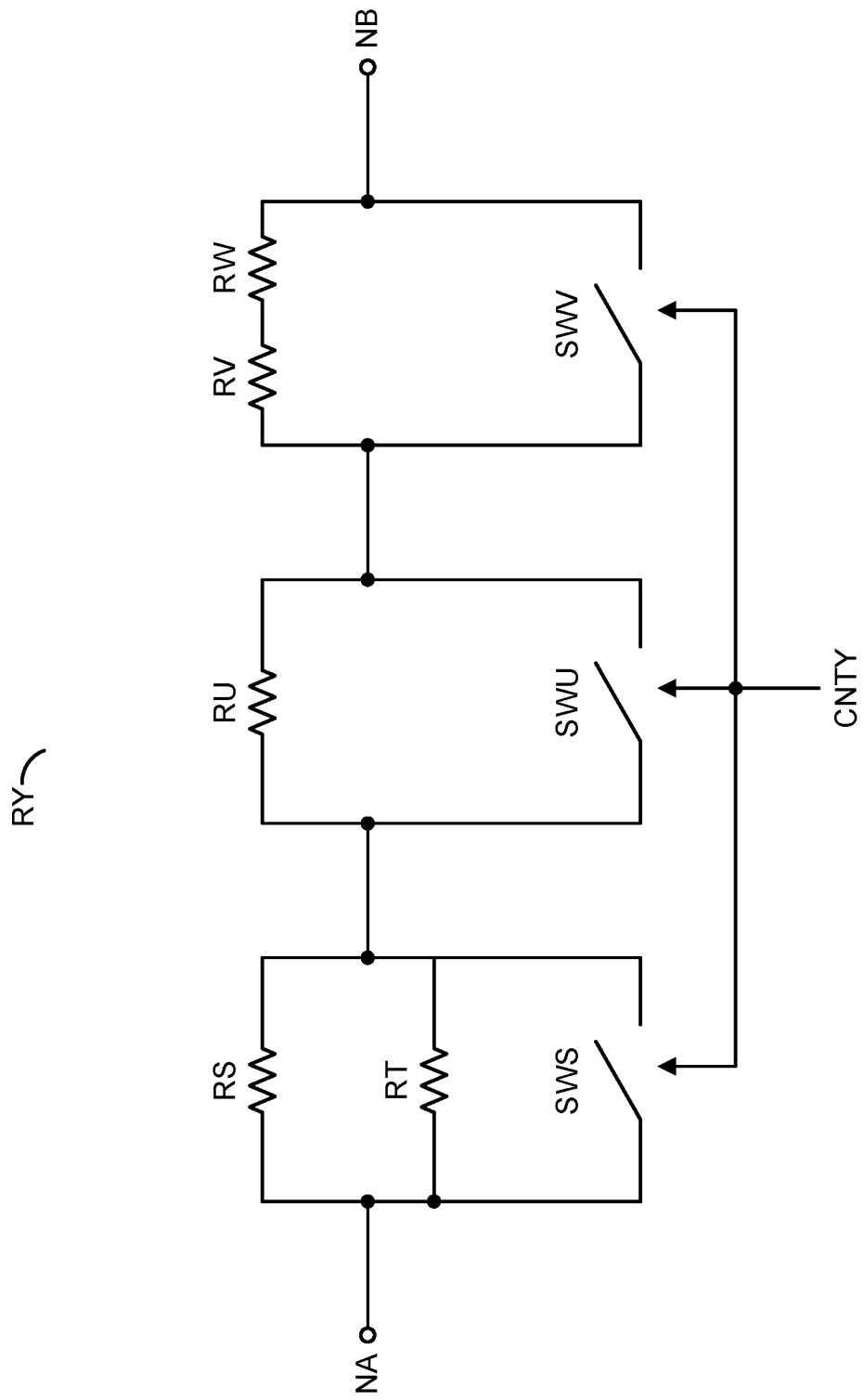
FIG. 5 is a schematic diagram of another programmable resistor.

Referring to FIG. 5, a schematic diagram of an example implementation of another programmable resistor RY is shown. The resistor RY may represent each of the replicant resistors R1 and R2 and/or the reference resistor 94. The resistor RY generally comprises multiple fixed resistors RS and RT connected in parallel to each other and connected to the node NA. A resistor RU may be connected in series to the resistors RS and RT. Resistors RV and RW may be connected in series to each other. The resistors RV and RW may be connected between the resistor RU and the node NB. A switch SWS may be connected in parallel to the resistors RS and RT. A switch SWU may be connected in parallel to the resistor RU. A switch SWV may be connected in parallel to the series resistors RV and RW. In various embodiments, each switch SWS, SWU and SWV may be implemented as a MOS or CMOS switch.

In various embodiments, the resistors RS to RW and the switches SWS to SWV may be used to implement a binary weighted switch. For example, where all of the switches RS to RW have a similar design and resistance (e.g., R and R=RS=RT=RU=RV=RW), by opening and closing various switches SWS to SWV, the resistor RY may be programmed (or controlled) to any value among 3.5 R (all switches open), 3.0 R, 2.5 R, 2.0 R, 1.5 R, 1.0 R, 0.5 R and 0 (all switches closed) ohms.

A signal (e.g., CNTY) may be received by switches SWS to SWV. The control signal CNTY may represent the control signals CNTA and/or CNTB. The signal CNTY may be a multi-bit (e.g., 3-bit) signal with a respective bit controlling each switch SWS to SWV. By selectively opening and closing the switches SWS to SWV, a variety of resistance values may be programmed from the resistor RY.

Figure 6:
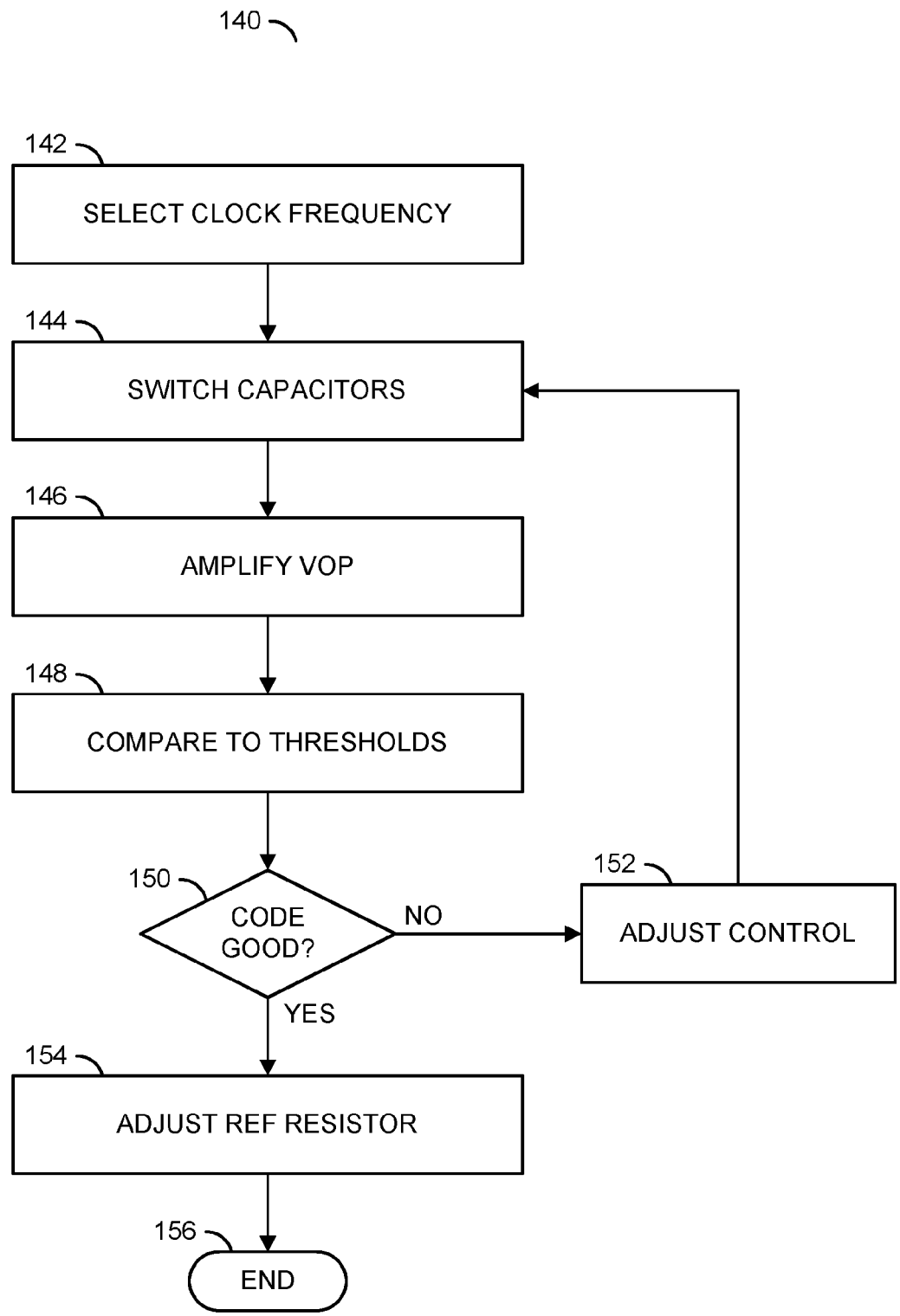
FIG. 6 is a flow diagram of method of verification.

Referring to FIG. 6, a flow diagram of an example method of verification 140 is shown. The method (or process) 140 may be implemented on the die 90. The method 140 generally comprises a step (or state) 142, a step (or state) 144, a step (or state) 146, a step (or state) 148, a decision step (or state) 150, a step (or state) 152, a step (or state) 154 and a step (or state) 156.

The verification method 140 may be initiated in the controller 92 by any one or more triggers. For example, the method 140 may begin on power up of the circuitry. In some embodiments, the method 140 may be performed periodically (e.g., once every second, once every minute, and so on). In other embodiments, the method 140 may be performed where a temperature change (e.g., ΔT) of the die 90 at or near the reference resistor 94 is greater than a predetermined value (e.g., one degree Celsius, 10 degrees Celsius, and so on). In some designs, the method 140 may be started due to an external trigger to re-calibrate the reference resistor 94. Other triggers may be implemented to meet the design criteria of a particular application.

In the step 142, the controller 92 may select a clock frequency and begin generating the signal CLK. The signal CNTA may be generated by the controller 92 at a default value (e.g., a mid-resistance value). The detector 104 may begin switching the capacitors C1 and C2 in the step 144 in response to the phases of the signal CLK. The amplifier 110 may amplify the resulting signal VOP in the step 146. In parallel with the amplification step, the LPF 114 may filter the signal VOP. In the step 148, the comparators 120 and 122 may compare the signal VG with the threshold voltages VHT1 and VHT2 to determine the codeword.

The controller 92 may examine the codeword in the decision step 150. If the codeword is not good (e.g., not within the calibration window), the controller 92 may adjust the resistance values of the replicant resistors R1 and R2 in the step 152. The method 140 may return to the step 144 and continue switching the capacitors C1 and C2. Once the controller 92 determines that the codeword has the "within range" codeword, the controller 92 may adjust the reference resistor 94 in the step 154. In the step 156, the controller 92 may hold the control value in the signal CNTB until the verification method 140 is started again.

Figure 7:
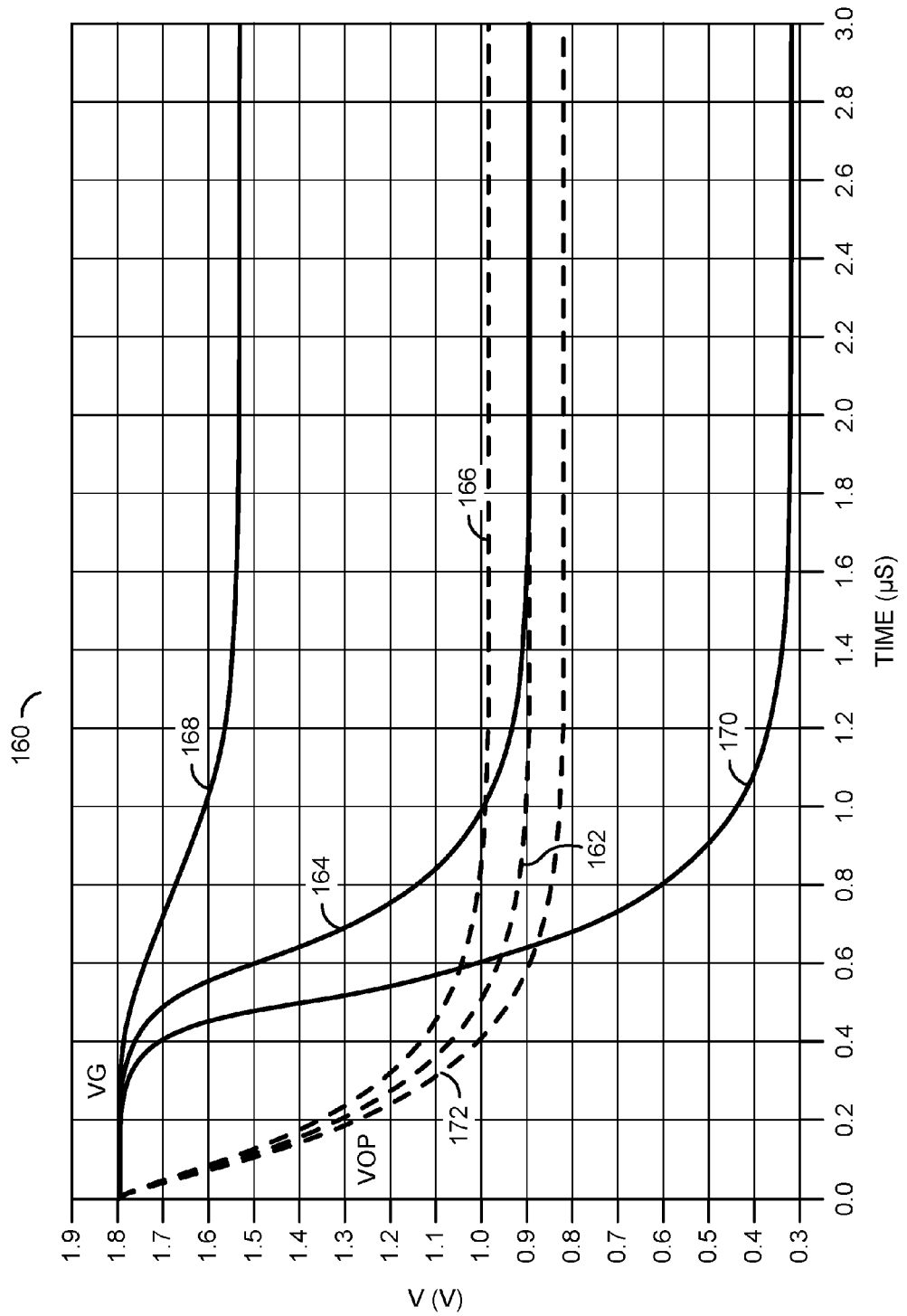
FIG. 7 is a graph of simulation results across process variations.

Referring to FIG. 7, a graph 160 illustrating example simulation results across process variations is shown. At a time zero (0.0 microseconds (μs)), the signal CLK may have the phase Φ1 active and the phase Φ2 inactive. The corner simulation generally shows the die 90 fabricated with a submicron (e.g., 0.18 micrometer (μm)) CMOS process, with R=24.2 kilo-ohms, Fclk=25 megahertz, C=1.65 picofarad and VDD=1.8 volts.

The curves 162 and 164 may illustrate the voltages in the signals VOP and VG, respectively, where the doping of the resistors 102 and 94 are at target levels. Both curves 162 and 164 generally settle to approximately half the power supply voltage VDD (e.g., 0.9=1.8/2 volts). The curve 164 may lag behind the curve 162 due to the low pass filter 114 and a delay through the amplifier 110.

The curves 166 and 168 generally illustrate the voltages in the signals VOP and VG, respectively, where the doping of the resistors 102 and 94 are above the target levels. The voltage in the signal VG may be consistently above the upper threshold voltage VHT1 and so the codeword may indicate that the resistance value is too small (or low).

The curves 170 and 172 generally illustrate the voltage in the signals VOP and VG, respectively where the doping of the resistors 102 and 94 are below the target levels. The voltage in the signal VG may be consistently below the lower threshold voltage VHT2 and so the codeword may indicate that the resistance value is too large (or high).

In a fast process corner where the restive values R1 and R2 generally decrease while the impedance values K1 and K2 generally increase (because the capacitance values C1 and C2 decrease), the voltage in the signal VOP may be higher than VDD/2. The increase in the voltage in the signal VOP may be designated as ΔVop. In a slow process corner where the resistive values R1 and R2 generally increase while the impedance values K1 and K2 generally decrease, the voltage in the signal VOP may be lower than VDD/2. The decrease in the voltage in the signal VOP may be designated as −ΔVop. In various embodiments, the delta voltage ±ΔVop may be amplified by the amplifier 110 to about ±600 millivolts. The corner simulation 160 generally shows that ±ΔVop is about ±80 millivolts. The more the resistance values deviate from the normal values, the larger the ΔVop value.

In various embodiments, a calibration loop may be derived such that the calibration of one or a few replicant resistors 102 may be recorded to reduce the fabrication variations. The recorded calibration information may be applied to all other resistors fabricated in (on) the die 90. The application of the recorded calibration information may be performed as part of a calibration process. By narrowing the voltage range between the threshold voltages VTH1 and VTH2, the resistance variations may be reduced to match that of the reference impedance K variations. As a result, reference currents and/or phase-locked loop bandwidths that depend on the absolute resistor values may be more consistent compared with common calibration techniques.

The resistive value of the reference resistor 94 and the replicant resistors 102 may be measured indirectly by varying the frequency of the signal CLK. Varying the clock frequency Fclk generally changes the impedance K of the capacitors C1 and C2. With the threshold voltages VHT1 and VHT2 set to known values (e.g., bracketing VDD/2), the frequency Fclk may be varied until the codeword achieves the "within the range" value. Using formulae (2) or (3), the average current I flowing in the replicant resistors 102 may be determined based on the capacitance values C1 or C2 and the frequency of the clock signal CLK when the codeword indicated in the range. Knowing the average current I and the voltage of the power supply VDD, the resistance of the replicant resistors 102 and the reference resistor 94 may be calculated.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a resistor fabricated on a die using a semiconductor process; and
   a circuit fabricated on said die using said semiconductor process and configured to (i) generate a measurement voltage at a node of said resistor as a function of a capacitance value and a frequency of a clock signal and (ii) generate a codeword in response to said measurement voltage, wherein (a) said codeword has a plurality of possible values and (b) a particular value of said possible values verifies that said voltage is between a plurality of threshold voltages.

2. The apparatus according to claim 1, wherein said semiconductor process comprises a complementary metal-oxide-semiconductor process.

3. The apparatus according to claim 1, wherein said resistor comprises two resistors (i) wired in parallel and (ii) each having a same resistance value.

4. The apparatus according to claim 1, wherein said circuit comprises a plurality of capacitors alternately connected to and disconnected from said resistor at said frequency of said clock signal to generate said measurement voltage.

5. The apparatus according to claim 4, wherein said circuit further comprises a plurality of switches each configured to discharge a respective one of said capacitors while said respective capacitor is disconnected from said resistor.

6. The apparatus according to claim 4, wherein said circuit further comprises an amplifier configured to amplify said measurement voltage relative to a fixed voltage to generate a gain signal that has a range from above to below said fixed voltage.

7. The apparatus according to claim 6, wherein said circuit further comprises a plurality of comparators configured to generate said codeword by comparing said gain signal to said threshold voltages.

8. The apparatus according to claim 1, further comprising an additional resistor having a same resistance value as said resistor, wherein said additional resistor is used to generate a reference signal that depends on said same resistance value.

9. The apparatus according to claim 1, wherein a resistance of said resistor is adjustable in response to a control signal to establish said particular value in said codeword.

10. The apparatus according to claim 1, wherein each of said plurality of threshold voltages is adjustable in response to a control signal.

11. A method for verifying a resistor value, comprising the steps of:
   generating a measurement voltage at a node of a resistor as a function of a capacitance value and a frequency of a clock signal, wherein said resistor is fabricated on a die using a semiconductor process; and
   generating a codeword in response to said measurement voltage in a circuit fabricated on said die using said semiconductor process, wherein (i) said codeword has a plurality of possible values and (ii) a particular value of said possible values verifies that said voltage is between a plurality of threshold voltages.

12. The method according to claim 11, wherein said semiconductor process comprises a complementary metal-oxide-semiconductor process.

13. The method according to claim 11, wherein said resistor comprises two resistors (i) wired in parallel and (ii) each having a same resistance value.

14. The method according to claim 11, further comprising the step of:
   alternately connecting and disconnecting a plurality of capacitors to and from said resistor at said frequency of said clock signal to generate said measurement voltage.

15. The method according to claim 14, further comprising the step of:
   discharging each respective one of said capacitors while said respective capacitor is disconnected from said resistor.

16. The method according to claim 14, further comprising the step of:
   amplifying said measurement voltage relative to a fixed voltage to generate a gain signal that has a range from above to below said fixed voltage.

17. The method according to claim 16, further comprising the step of:
   generating said codeword by comparing said gain signal to said threshold voltages.

18. The method according to claim 11, wherein (i) an additional resistor has a same resistance value as said resistor and (ii) said additional resistor is used to generate a reference signal that depends on said same resistance value.

19. The method according to claim 11, further comprising the steps of:
   adjusting a resistance of said resistor in response to a first control signal to establish said particular value in said codeword; and
   adjusting each of said plurality of threshold voltages in response to a second control signal.

20. An apparatus comprising:
   a controller configured to generate a clock signal; and
   a circuit fabricated on a die using a semiconductor process, comprising a resistor and configured to (i) generate a measurement voltage at a node of said resistor as a function of a capacitance value and a frequency of said clock signal and (ii) transfer to said controller a codeword generated in response to said measurement voltage, wherein (a) said codeword has a plurality of possible values and (b) a particular value of said possible values verifies that said voltage is between a plurality of threshold voltages.

* * * * *